(12) United States Patent
Horng

(10) Patent No.: US 7,677,298 B2
(45) Date of Patent: Mar. 16, 2010

(54) JOINTING STRUCTURE OF A HEAT DISSIPATING FIN

(76) Inventor: Chin-Hsing Horng, No. 2, Alley 8, Lane 2, Min-Sheng North Road Sec. 1, Kuei-Shan Town, Taoyuan County (TW)

( * ) Notice: Subject to any disclaimer, the term of this patent is extended or adjusted under 35 U.S.C. 154(b) by 273 days.

(21) Appl. No.: 11/879,134

(22) Filed: Jul. 17, 2007

(65) Prior Publication Data

US 2009/0020279 A1 Jan. 22, 2009

(51) Int. Cl.
*H05K 7/20* (2006.01)
(52) U.S. Cl. ..................... 165/80.3; 361/704
(58) Field of Classification Search .............. 165/80.3, 165/185; 361/704, 710
See application file for complete search history.

(56) References Cited

U.S. PATENT DOCUMENTS

| 7,190,588 | B2 * | 3/2007 | Lee et al. ............ 361/704 |
| 7,284,597 | B2 * | 10/2007 | Tang ............... 165/80.3 |
| 7,304,851 | B2 * | 12/2007 | Chou ............... 361/710 |
| 2004/0194922 | A1 * | 10/2004 | Lee et al. ........... 165/78 |
| 2005/0051297 | A1 * | 3/2005 | Kuo ............... 165/80.3 |
| 2005/0056398 | A1 * | 3/2005 | Lai ............... 165/80.3 |
| 2006/0012961 | A1 * | 1/2006 | Lee et al. ........... 361/704 |
| 2006/0162920 | A1 * | 7/2006 | Chou ............... 165/185 |

\* cited by examiner

*Primary Examiner*—Allen J Flanigan

(57) ABSTRACT

A jointing structure of a heat dissipating fin, disposed on an upper level edge and a lower level edge of each fin body of the heat dissipating fin, comprises at least one hole or more on each of the level edges, at least one lock tab or more on the fin body of the heat dissipating fin corresponding to the hole, and the lock tab is formed by directly folding the fin body instead of extendingly disposed from the upper and lower level edges. More than one protrusion is disposed on each of the lock tabs. The protrusions on the lock tabs of the upper and lower level edges in a previous fin body are coupled into the corresponding holes of the upper and lower level edges in a next fin body, so as to join multiple heat dissipating fins integrally and stably.

1 Claim, 3 Drawing Sheets

JOINTING STRUCTURE OF A HEAT DISSIPATING FIN

FIELD OF THE INVENTION

The invention herein relates to a jointing structure of a heat dissipating fin having a simple structure, easy installation and cost-effectiveness.

DESCRIPTION OF THE PRIOR ART

The conventional jointing structure of a heat dissipating fin (also known as a coupling structure or a connector) as revealed in the previous disclosure includes Taiwan Patents No. 468931, No. 524343, No. 484704, No. 558009, as well as U.S. Pat. No. 6,499,160, U.S. Pat. No. 6,382,307 or U.S. Pat. No. 6,619,381; one unit or more than one pair of hooks, hook sections or fastening components are extendingly disposed on an upper level edge or a lower level edge of a heat dissipating fin body, and holes are disposed on the positions of the upper/lower level edges or of the heat dissipating fin body corresponding to the hooks, hook sections or fastening components. The conventional jointing structure may allow a previous fin body to be coupled to a next fin body, via the method of connecting the hooks (or hook sections or fastening components) extendingly disposed on the upper edge and the lower edge of the previous fin body to the holes correspondingly disposed on the upper/lower level edges of the next fin body, so that a plurality of heat dissipating fins may be joined together integrally. However, the hooks (or hook sections or fastening components) must be extendingly formed on the upper level edge and the lower level edge thereof, which results in increased width or length in the components. Since the fin bodies of general heat dissipating fins are made of expensive materials like copper alloys or aluminum alloys, the increased width or length in the components will further raise the manufacturing cost, and this is the biggest problem of the conventional jointing structure of a heat dissipating fin. Further, there is another problem existing in the conventional jointing structure of a heat dissipating fin; because the hooks (or hook sections or fastening components) of the conventional jointing structure of a heat dissipating fin are extendingly formed from the outer edge of the upper level edge and the lower level edge thereof, this increases the length of the hooks (or hook sections or fastening components) and compromises its structural strength, thereby impeding the process of joining fin bodies of a heat dissipating fin together.

In the conventional jointing structure of a heat dissipating fin, the width or length of the hooks thereof (or hook sections or fastening components) must be increased to meet actual needs, which not only raises the manufacturing cost, compromises the structural strength, but also impedes the process of joining fin bodies of a heat dissipating fin together, thus the inventor of the invention conducted research which culminated in the enhanced jointing structure of a heat dissipating fin of the present invention.

SUMMARY OF THE INVENTION

The objective of the invention herein is to provide a jointing structure of a heat dissipating fin having a simple structure and easy installation so as to reduce manufacturing cost and materials.

To achieve the objective of the invention, a jointing structure of a heat dissipating fin is disposed on an upper level edge and a lower level edge of each fin body of the heat dissipating fin, comprising at least more than one hole disposed on each of the level edges, at least more than one lock tab disposed on the fin body of the heat dissipating fin corresponding to each of the holes, and the lock tabs formed via directly folding the fin bodies instead of extendingly disposed from the upper level edge and the lower level edge. More than one protrusion is separately disposed on each of the lock tabs. In addition, an inclined plane that faces downwardly or upwardly may be respectively formed at two edges of the upper level edge and the lower level edge, or more than one square-bracket inclined plane may be formed at the middle sections of the upper level edge and the lower level edge, or both the inclined planes and the square-bracket inclined planes may be formed together. To join a plurality of fin bodies of the heat dissipating fins, the protrusions on the lock tabs of the upper level edge and the lower level edge in a previous fin body are coupled into the corresponding holes of the upper level edge and the lower level edge in a next fin body, to thereby join multiple heat dissipating fins together integrally and stably. Therefore, the manufacturing cost may be effectively reduced, and the problem of insufficient structural strength and impediment to the connection of fin bodies may be resolved.

BRIEF DESCRIPTION OF DRAWINGS

The structure and the technical means adopted by the present invention to achieve the above and other objectives can be best understood by referring to the following detailed description of the preferred embodiments and the accompanying diagrams, wherein.

DETAILED DESCRIPTION OF PREFERRED EMBODIMENTS

Figure 1:
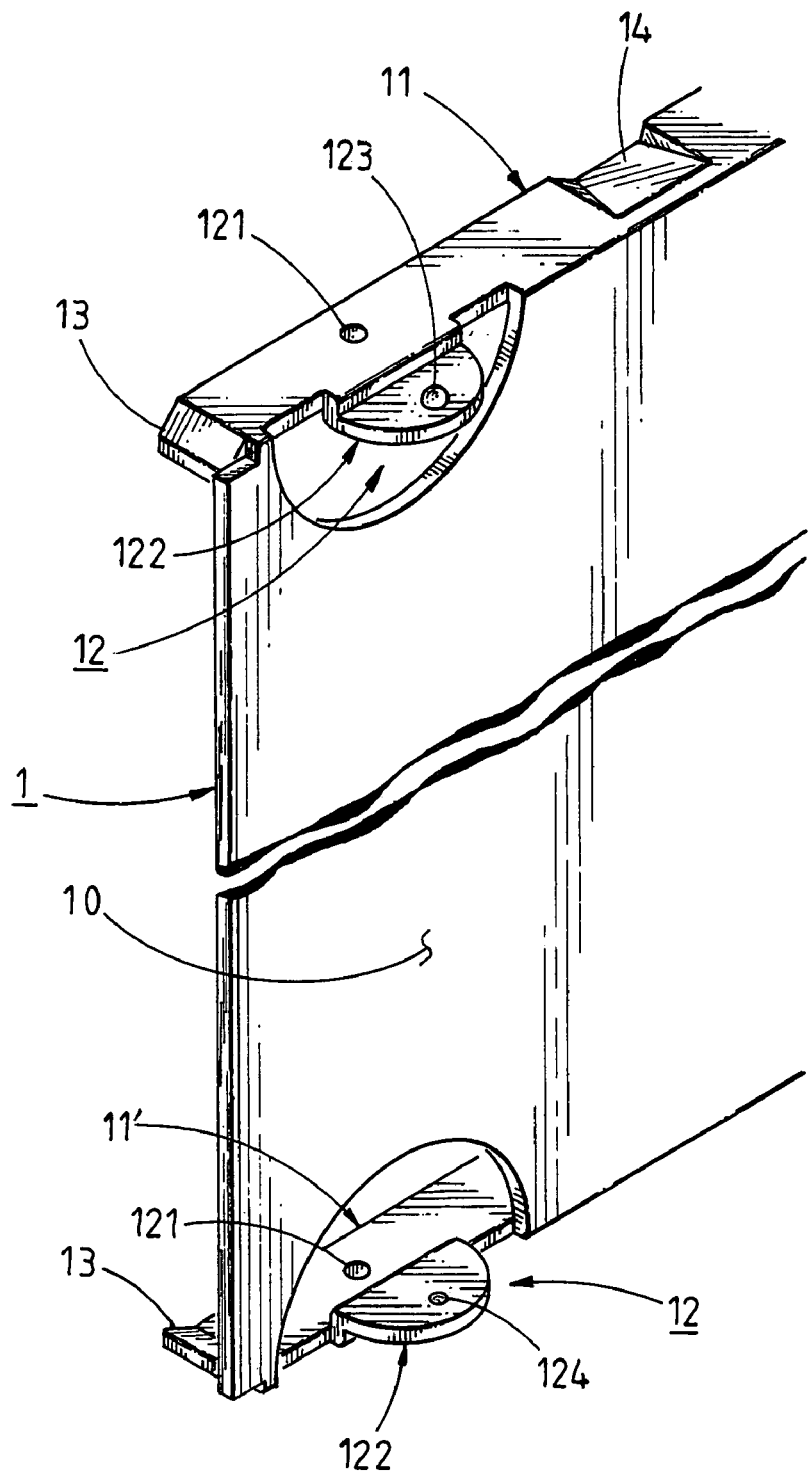
FIG. 1 is an isometric drawing of a heat dissipating fin of the invention.
Figure 2:
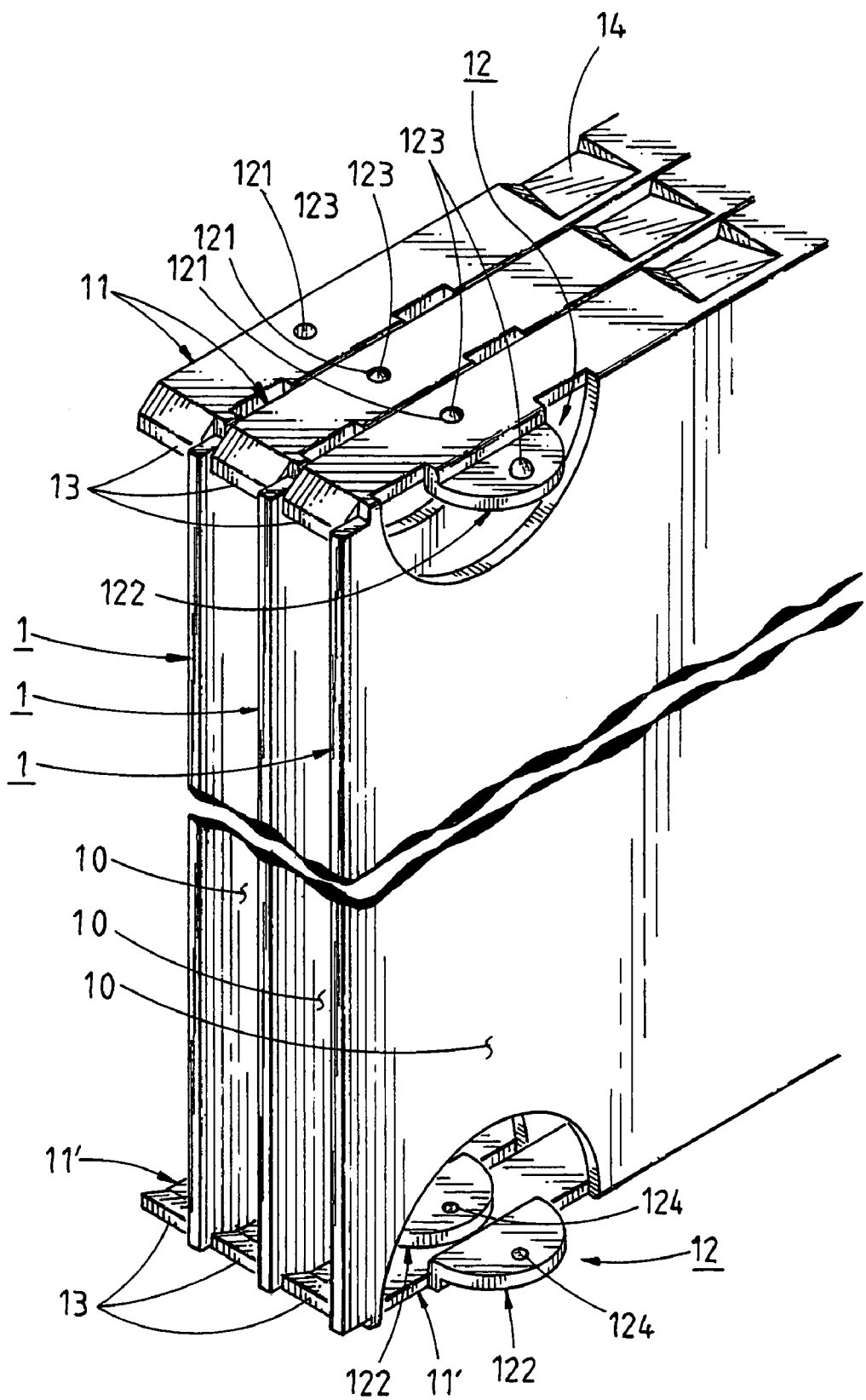
FIG. 2 is a three-dimensional view that shows the coupling of the heat dissipating fins of the invention.

Referring to FIG. 1, each fin body 10 of a heat dissipating fin 1 of the invention has a basic structure identical to that of a conventional fin body of a heat dissipating fin. The fin body 10 has an upper level edge 11 formed on the upper side and a lower level edge 11' formed on the lower side thereof, and more than one jointing structure 12 is separately disposed on the upper level edge 11 and the lower level edge 11'. It should be noted that a jointing structure 12 of the invention has more than one hole 121 disposed on each of the upper level edges 11 and the lower level edges 11', as well as more than one lock tab 122 disposed on the position of the fin body 10 that is corresponding to each of the holes 121. The jointing structure 12 is formed via folding the fin body 10 directly, and is not extendingly disposed from the upper level edge 11 and the lower level edge 11'. In addition, more than one protrusion 123 (the protrusion 123 on the lock tab 122 at a lower side of the fin body 10 is concealed by the fin body 10, and only an indentation 124 for shaping the protrusion 123 is shown in FIG. 1) is respectively disposed on the lock tab 122 at the upper side of the fin body 10, and disposed beneath the lock tab 122 at the lower side of the fin body 10. Each of the protrusions 123 on the previous fin body is coupled into the corresponding hole 121 (as shown in FIG. 2) located on the upper level edge 11 and the lower level edge 11' of the adjacent fin body 10 of another heat dissipating fin 1, so that a plurality of fin bodies 10 may be joined together integrally. Moreover, an inclined plane 13 is respectively folded downwardly and upwardly at two edges of the upper level edge 11 and the lower level edge 11', or more than one square-bracket inclined plane 14 is formed at the middle sections of the upper level edge 11 and the lower level edge 11' respectively (the square-bracket inclined planes 14 on the lower level edges 11' are concealed by the fin bodies 10, thus are not shown in FIG. 2), or both of the inclined planes 13 and the square-bracket inclined planes 14 may be disposed simultaneously.

As indicated in FIG. 2, to connect several or a plurality of heat dissipating fins 1, simply insert the lock tabs 122 of each jointing structure 12 on the upper and lower level edges of the fin body 10 of the previous heat dissipating fin 1 into the lower side of the upper level edge 11 and the upper side of the lower level edge 11' on the fin body 10 of a next heat dissipating fin 1, and couple the protrusions 123 on each of the lock tabs 122 into the holes 121 of the upper level edge 11 and the lower level edge 11' respectively, and thus the fin bodies 10 from two adjacent heat dissipating fins 1 are joined integrally and stably. Subsequently, the next fin body 10 is coupled to a further fin body 10 of the heat dissipating fin 1, so as to connect a series of heat dissipating fins and to assemble several or a plurality of fin bodies 10 of the heat dissipating fins 1 integrally. Then, copper or silver is used to solder the heat dissipating fins onto a plate in order to form a heat sink (omitted in the drawings). Because the inclined planes 13 or the square-bracket inclined planes 14 are disposed on the upper level edge 11 and the lower level edge 11' of each fin body 10 in the heat dissipating fin 1, when two fin bodies 10 are to be joined together, the protrusions 123 on the lock tabs 122 of the jointing structures 12 are coupled into the corresponding holes 121 on the upper level edge 11 and the lower level edge 11' for joining the fin bodies 10 integrally. In addition, the inclined planes 13 or the square-bracket inclined planes 14 (or both) disposed on the upper level edge 11 and the lower level edge 11' of a next fin body 10 may be pressed against the front side of a previous fin body 10, so that not only the adjacent fin bodies 10 may be coupled more tightly and unable to be loosened, but also the fin bodies 10 are properly aligned and spaced from each other.

Figure 3:
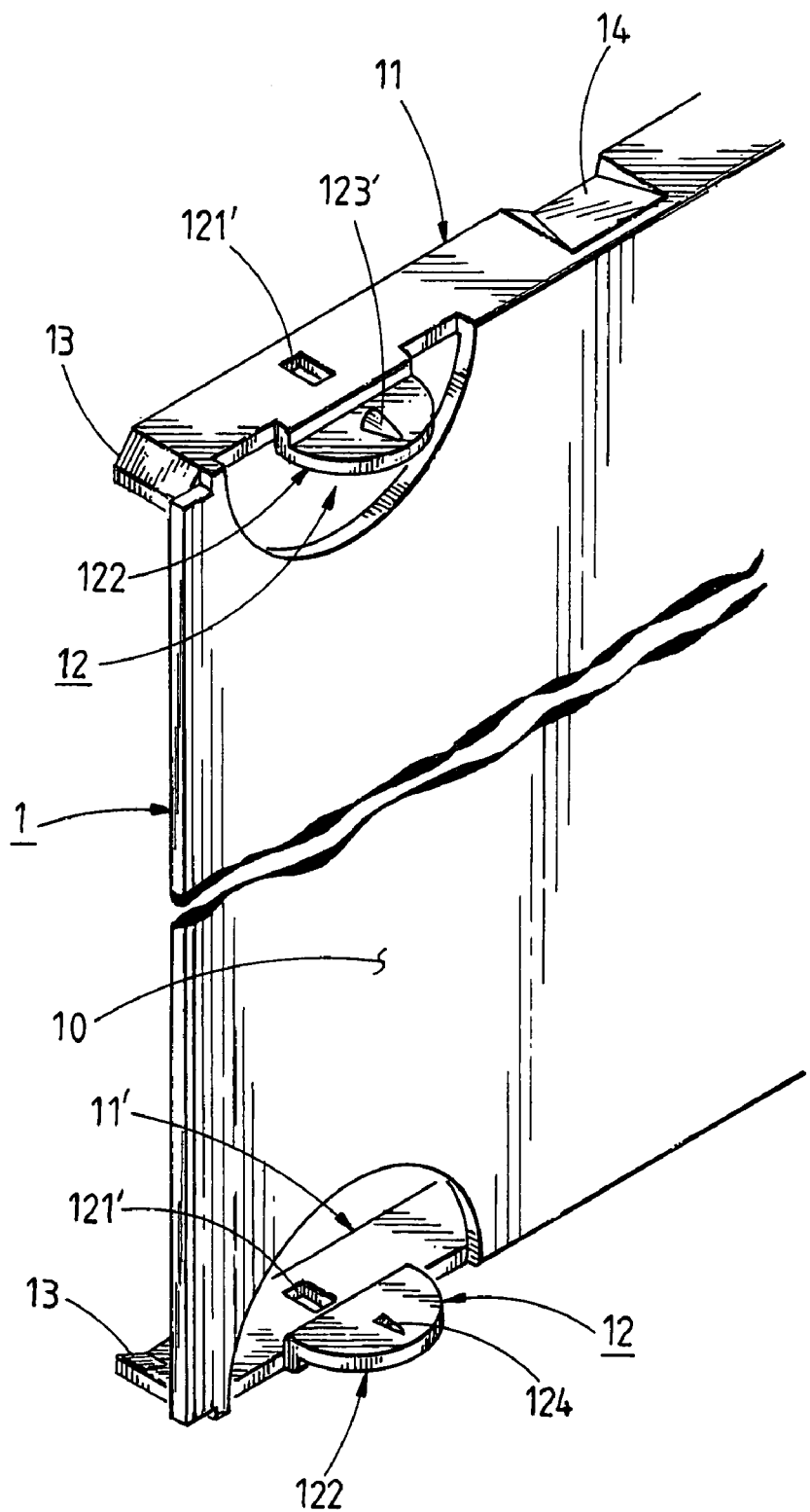
FIG. 3 is an isometric drawing of another preferred embodiment of the heat dissipating fin of the invention.

Referring to FIG. 3, in the jointing structures 12 of the invention, the holes 121 on the upper level edge 11 and the lower level edge 11' may be formed as circular holes as described in the aforesaid embodiment, or can be formed as rectangular holes 121' as shown in FIG. 3, or formed as holes of other geometric shapes. Moreover, the semi-spherical protrusions 123 on each of the lock tabs 122 may also be formed as wedge-shaped protrusions 123' or protrusions of other similar shapes. Similarly, the lock tab 122 of each jointing structure 12 may be disposed in the form of semi-circle (as shown in FIG. 3), or in the form of triangle, rectangle, trapezoid or arc. So long as the holes 121 and the rectangular holes 121' may be correspondingly coupled to the protrusions 123 and the wedge-shaped protrusions 123', to thereby ensure the fin bodies 10 being coupled to each other securely.

Although a preferred embodiment of the invention has been described for purposes of illustration, it is understood that various changes and modifications to the described embodiment can be carried out without departing from the scope and the spirit of the invention as disclosed in the appended claims.

The invention claimed is:

1. A jointing structure of a heat dissipating fin, disposed on an upper level edge and a lower level edge on each fin body of a heat dissipating fin respectively, further comprising: at least one hole or more disposed on the upper level edge and the lower level edge respectively; at least one lock tab or more disposed on each fin body of the heat dissipating fin corresponding to the hole, the lock tab being formed via directly folding the fin body; one protrusion or more respectively disposed on the lock tab at an upper side of the fin body and beneath the lock tab at a lower side thereof; each said protrusion of a previous fin body being sequentially coupled into the corresponding hole on the upper level edge and the lower level edge of a next adjacent fin body so as to join a plurality of fin bodies of heat dissipating fins integrally; the hole being formed as circular, rectangular or other geometrical shapes; the protrusion being formed as semi-spherical, wedge-shaped, or other similar shapes; and the lock tab being disposed as semi-circular, triangular, rectangular, trapezoid, or arc-shaped forms; wherein an inclined plane is respectively folded downwardly and upwardly at two edges of the upper level edge and the lower level edge; or at least one square-bracket inclined plane or more may be disposed at the middle sections of the upper level edge and the lower level edge; or simultaneously, both the inclined planes are disposed at two edges of the upper level edge and the lower level edge, and one square-bracket inclined plane or more is disposed at the middle sections of the upper level edge and the lower level edge.

* * * * *